United States Patent
Lee et al.

[11] Patent Number: 6,033,983
[45] Date of Patent: Mar. 7, 2000

[54] METHOD FOR FORMING BARRIER METAL LAYER OF SEMICONDUCTOR DEVICE

[75] Inventors: Kyeong Bock Lee; Sung Gon Jin, both of Gyunggi-do, Rep. of Korea

[73] Assignee: Hyundai Electronics Industries Co., Ltd., Yicheon, Rep. of Korea

[21] Appl. No.: 09/081,776

[22] Filed: May 20, 1998

[30] Foreign Application Priority Data

Jun. 25, 1997 [KR] Rep. of Korea ............ 97-27376

[51] Int. Cl.[7] ............................................ H01L 21/44
[52] U.S. Cl. .................... 438/637; 438/643; 438/659; 438/627
[58] Field of Search ............................ 438/637–640, 438/627, 636, 643, 644, 653, 672, 675, 659, 629

[56] References Cited

U.S. PATENT DOCUMENTS

| | | |
|---|---|---|
| 4,829,024 | 5/1989 | Klein et al. ........................ 438/653 |
| 4,990,997 | 2/1991 | Nishida ............................. 357/71 |
| 5,250,467 | 10/1993 | Somekh et al. .................... 438/643 |
| 5,381,302 | 1/1995 | Sandhu et al. . |
| 5,449,641 | 9/1995 | Maeda ............................. 438/643 |
| 5,514,908 | 5/1996 | Liao et al. . |
| 5,523,595 | 6/1996 | Takenaka et al. . |
| 5,646,075 | 7/1997 | Thakur et al. . |
| 5,652,464 | 7/1997 | Liao et al. . |
| 5,700,726 | 12/1997 | Huang et al. ..................... 438/627 |
| 5,833,817 | 11/1998 | Tsai et al. ........................ 438/696 |

*Primary Examiner*—Charles Bowers
*Assistant Examiner*—Thanh Nguyen
*Attorney, Agent, or Firm*—Oliff & Berridge, PLC

[57] ABSTRACT

A method for forming a barrier metal layer of semiconductor device is disclosed. According to the present invention, pre-cleaning, oxygen plasma treatment and formation of barrier metal layer are performed by in-situ type in one same conventional chamber. This method results in the reduction of cost and process time.

8 Claims, 2 Drawing Sheets

Figure 1
Fig 1a
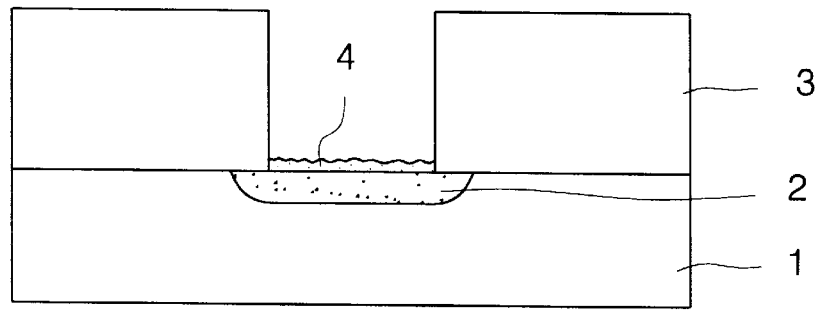
Fig 1b
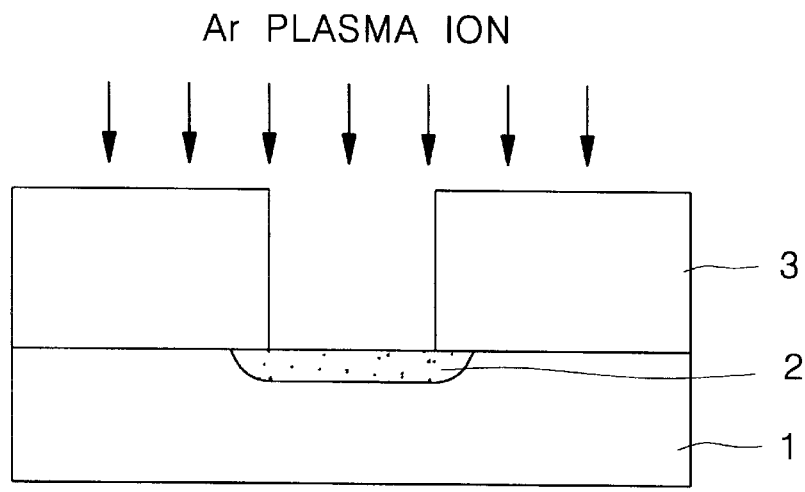
Fig 1c
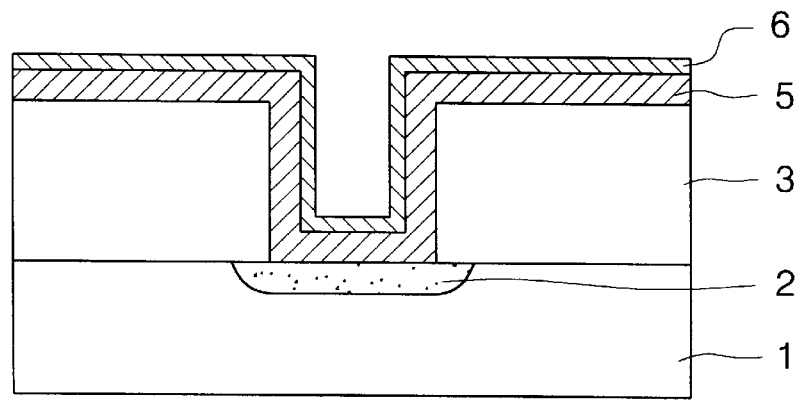

METHOD FOR FORMING BARRIER METAL LAYER OF SEMICONDUCTOR DEVICE

BACKGROUND OF THE INVENTION

1. Field of the Invention

The present invention relates to a method for forming a barrier metal layer of semiconductor device.

2. Description of the Prior Art

Generally, a barrier metal layer, which is formed between aluminum and junction, is used to prevent junction breakdown due to metal diffusion.

To form such a barrier metal layer, initially after forming an insulating layer on a silicon wafer having a junction therein, a contact hole is made in the insulating layer by partially etching the insulating layer to expose the junction. Since natural silicon oxide layer will always build up on the surface of the exposed junction, the natural silicon oxide layer should be stripped prior to the formation of the barrier metal layer since it degrades the electric properties of the semiconductor device. In the prior art, wet cleaning process or dry cleaning process using etching gases such as $CH_4/O_2$ and $NF_3$ was used to eliminate the natural silicon oxide layer. This process requires additional equipment as well as demanding much process time since it is not an in-situ type process.

Also as the size of the contact hole becomes smaller as semiconductor device dimension decreases, poor step coverage of the barrier metal layer due to small contact size causes problems in barrier reliability.

SUMMARY OF THE INVENTION

Therefore, the object of the present invention is to provide a method for forming a barrier metal layer of semiconductor device of superior barrier properties and reduce process time using the existing equipment.

In order to accomplish the aforementioned object, the present invention provides a method for forming a barrier metal layer of semiconductor device, comprising:

a first step of making a contact hole in an insulating layer by etching the insulating layer to expose a junction after forming the insulating layer on a silicon wafer having a junction therein; a second step of forming a refractory metal layer on the overall surface after stripping a natural silicon oxide layer that has built up on the surface of the junction; a third step of depositing a refractory metal nitride layer having a predetermined thickness on the resultant of the second step; a fourth step of treating the metal nitride layer with oxygen plasma, transforming the surface of the metal nitride layer an amorphous structure and also implanting oxygen ions therein; and a fifth step of depositing a remaining thickness of refractory metal nitride layer on the resultant of the fourth step.

In the present invention, pre-cleaning and the formation of the barrier metal layer is performed by in-situ process in one chamber.

BRIEF DESCRIPTION OF THE DRAWINGS

The detailed description particularly refers to the accompanying drawings in which:

FIG. 1a to FIG. 1e are the cross sectional views that describes the method for forming a barrier metal layer of semiconductor device according to the present invention.

DETAILED DESCRIPTION OF THE PREFERRED EMBODIMENTS

Figure 1D:
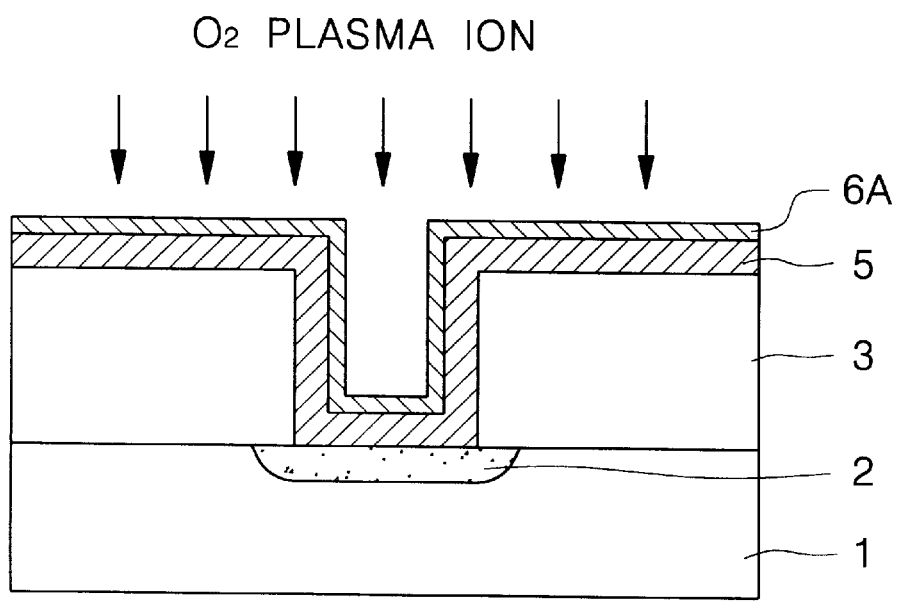

Hereinafter, the present invention will be described in detail referring to the accompanying drawings.

FIG. 1a shows an insulating layer 3 partially etched to expose a junction 2 after insulating layer 3 is formed on a silicon wafer 1 having a junction 2 therein. A natural silicon oxide layer 4 builds up on the surface of the exposed portion of junction 2.

FIG. 1b shows pre-cleaning process performed using argon gas to eliminate natural silicon oxide layer 4 that has built up on the surface of the exposed portion of junction 2. The pre-cleaning is performed by plasma etching process using argon gas. In this case, the radio frequency(RF) power for generating argon plasma is applied with a low value less than 300 W to prevent the damage of silicon wafer 1 resulting from physical collision of argon plasma.

FIG. 1c shows a refractory metal layer and a refractory metal nitride layer consecutively formed in the same chamber on the resultant of FIG. 1b. When the refractory metal layer 5 such as titanium is formed, argon gas is used as an ambient gas. On the other hand, when the refractory metal nitride layer 6 is formed, a mixture of argon gas and nitrogen gas is used as an ambient gas. The thickness of refractory metal nitride layer 6 formed in this step is set less than 50% of desired thickness.

FIG. 1d shows the surface of refractory metal nitride layer 6A treated with oxygen plasma generated by RF bias. In this step, the surface of refractory metal nitride layer 6A is transformed into an amorphous structure by the collision of the plasma ions, and subsequently oxygen ions are implanted in the transformed refractory metal nitride layer 6A. Amorphous refractory metal nitride layer 6A displays enhanced barrier effect because it extends the diffusion path between aluminum and silicon during metal interconnection process. The implantation of the oxygen ions is also effective in preventing the metal diffusion during metal interconnection process.

Figure 1E:
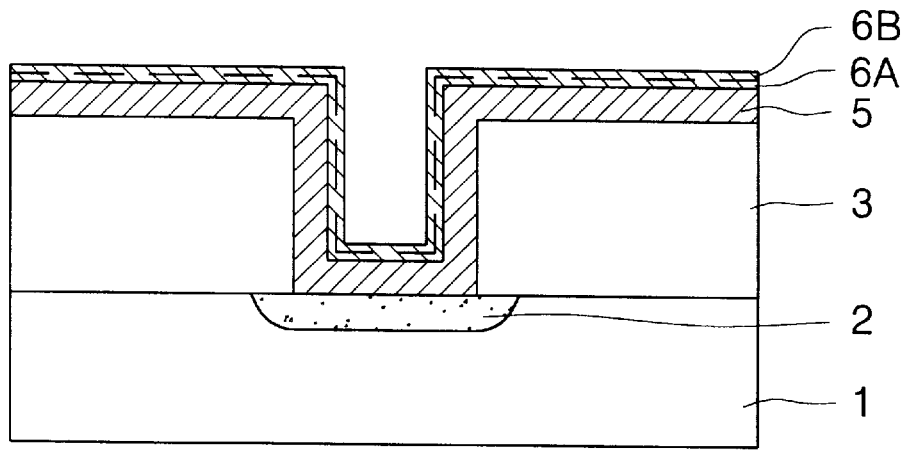

FIG. 1e shows a complete barrier metal layer 6A and 6B formed by depositing the desired remaining thickness of refractory metal nitride layer 6A.

Especially, if refractory metal nitride layer 6 is repeatedly deposited in parts in several deposition steps and treated with oxygen plasma by RF bias following after each deposition step, enhanced barrier properties can be achieved. Moreover, after the successive oxygen plasma treatments as described in FIG. 1d, oxygen plasma treatment performed after the formation of barrier metal layer 6A and 6B can be omitted. For example, if aluminum is deposited on an oxide layer treated with oxygen plasma, the relatively poor surface roughness of the aluminum causes reliability problems in device.

As described above, the pre-cleaning, the oxygen plasma treatment and the formation of barrier metal layer is performed by in-situ type in one same chamber, resulting in the reduction of cost and process time. Further, if low RF power is applied during the pre-cleaning process, the wafer can be cleaned without causing damage to the bottom of contact holes.

Since the oxygen plasma treatment performed during the formation of the refractory metal nitride layer has the same effect as the thermal process, successive thermal process is unnecessary. The formation of barrier metal layer and the aluminum deposition can be performed in a same chamber by the omission of successive thermal process. According to the method of the invention, four processes can be consecutively performed in the same chamber. Therefore compared with prior arts, both process steps and process time can be drastically reduced.

The structures and methods disclosed herein illustrate the principles of the present invention. The invention may be embodied in other specific forms without departing from its spirit or essential characteristics. The described embodiments are to be considered in all respects as exemplary and illustrative rather than restrictive. Therefore, the appended claims rather than the foregoing description define the scope of the invention. All modifications to the embodiments described herein that come within the meaning and range of equivalence of the claims are embraced within the scope of the invention.

What is claimed is:

1. A method for forming a barrier metal layer of semiconductor device, comprising:
   a first step of making a contact hole in an insulating layer by etching the insulating layer to expose a junction after forming the insulating layer on a silicon wafer having a junction therein;
   a second step of forming a refractory metal layer on the overall surface after stripping a natural silicon oxide layer built up on the surface of the junction;
   a third step of depositing a refractory metal nitride layer having a thickness on the resultant of the second step;
   a fourth step of treating the metal nitride layer with oxygen plasma, transforming the surface of the metal nitride layer an amorphous structure and also implanting oxygen ions therein; and
   a fifth step of depositing a remaining thickness of refractory metal nitride layer on the resultant of the fourth step.

2. The method of claim 1, wherein the processes of the first to the fifth steps are performed by in-situ type.

3. The method of claim 1, wherein said natural oxide layer is stripped by plasma etching process using argon gas and RF power.

4. The method of claim 3, wherein said RF power is applied with a range of 100 to 300 W.

5. The method of claim 1, wherein said refractory metal layer is deposited in argon gas ambient.

6. The method of claim 1, wherein said refractory metal nitride layer is deposited in a mixture of argon gas and nitrogen gas ambient.

7. The method of claim 1, wherein the third and fourth steps are repeatedly performed after the fourth step to form the total thickness of metal nitride layer.

8. The method of claim 1, wherein the thickness of refractory metal nitride layer formed in the third step is set less than 50% of the total thickness of refractory metal nitride layer.

\* \* \* \* \*